United States Patent [19]
Li et al.

[11] Patent Number: 5,828,609
[45] Date of Patent: Oct. 27, 1998

[54] SIMULATED DRAM MEMORY BIT LINE/BIT LINE FOR CIRCUIT TIMING AND VOLTAGE LEVEL TRACKING

[75] Inventors: Li-Chun Li, Los Gatos; Lawrence C. Liu, Menlo Park, both of Calif.; Michael A. Murray, Bellevue, Wash.

[73] Assignee: Mosel Vitelic Corporation, San Jose, Calif.

[21] Appl. No.: 760,125

[22] Filed: Dec. 3, 1996

[51] Int. Cl.$^6$ .................................................. G11C 7/00
[52] U.S. Cl. ................................... 365/203; 365/205
[58] Field of Search ........................ 365/203, 205

[56] References Cited

U.S. PATENT DOCUMENTS 5,262,999  11/1993  Etoh et al. ............................... 365/226
5,627,789  5/1997  Kalb, Jr. .................................... 365/205
5,636,774  6/1997  Rao ............................................ 365/203

*Primary Examiner*—David C. Nelms
*Assistant Examiner*—Michael T. Tran
*Attorney, Agent, or Firm*—Skjerven, Morrill, MacPherson, Franklin & Friel LLP

[57] ABSTRACT

The voltages on the high voltage rails of sense amplifiers in dynamic random access memories are controlled during turn-on of the sense amplifiers to remain approximately at the voltage of the voltage source internal to the integrated circuit chip by connecting a voltage source external to the chip to the high voltage rails until the voltages on the rails equal the voltage from the chip's internal voltage source at which time the external voltage source is disconnected.

11 Claims, 4 Drawing Sheets

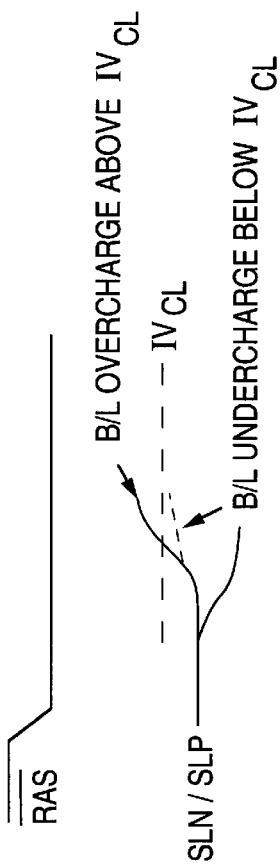
FIG. 1C
(PRIOR ART)
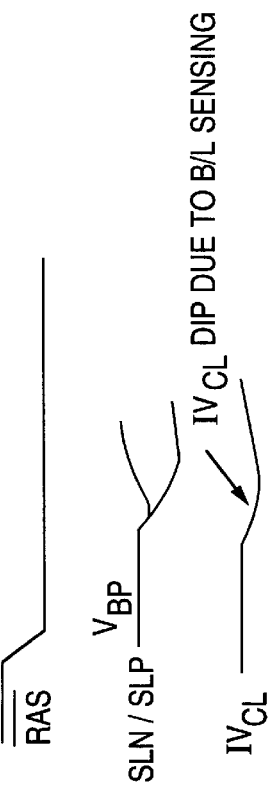
FIG. 1D
(PRIOR ART)
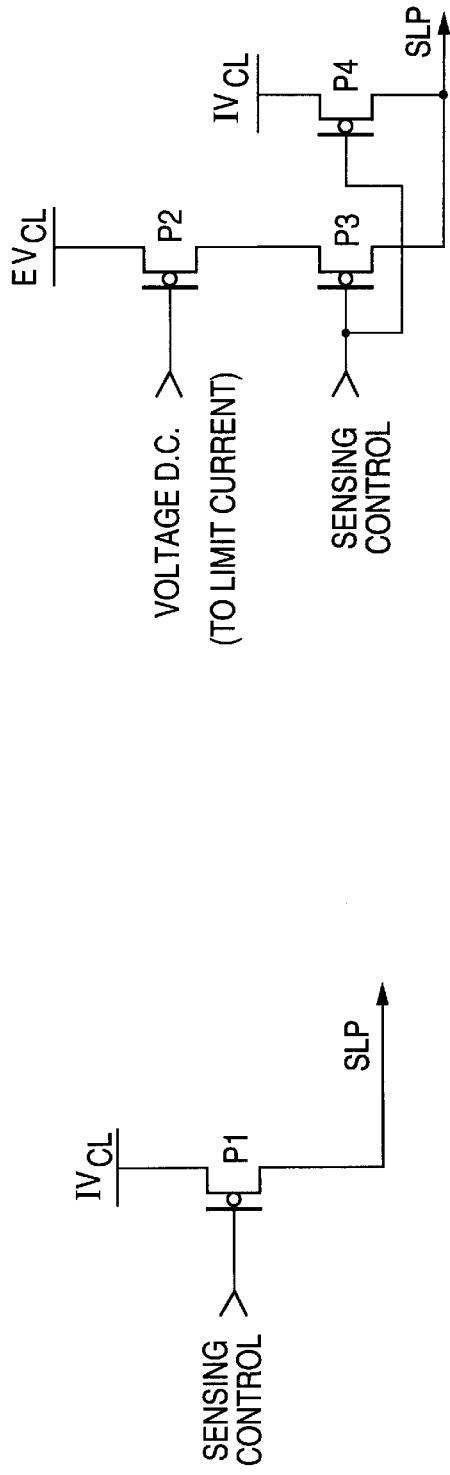
FIG. 1A
(PRIOR ART)
FIG. 1B
(PRIOR ART)

SIMULATED DRAM MEMORY BIT LINE/BIT LINE FOR CIRCUIT TIMING AND VOLTAGE LEVEL TRACKING

FIELD OF THE INVENTION

This invention relates to dynamic random access memories ("DRAMs") with internal voltage converters and in particular to structure and a method for preventing the bit lines associated with DRAM arrays from being charged above or below the internal power supply voltage level.

BACKGROUND

Dynamic random access memories use sense amplifiers to sense the state of a memory cell containing information being read out of the memory. Each sense amplifier normally is off but to read out the state of the memory cell connected to the sense amplifier, the sense amplifier must be turned on. This is done by applying a pullup voltage SLP and a pull-down voltage SLN to the power supply and reference voltage rails, respectively, of the sense amplifier. Unfortunately, when the sense amplifiers in a DRAM are turned on the current drawn by the sense amplifiers is quite substantial and causes the internal voltage levels on the bit line BL and bit line $\overline{BL}$ connected to each sense amplifier to vary and in particular to either overcharge above the internal voltage $IV_{CL}$ of the circuit or not charge high enough and therefore charge below $IV_{CL}$. The larger the capacitance associated with the bit lines BL and $\overline{BL}$ the greater the dip in the internal voltage $IV_{CL}$.

One prior art technique for overcoming this problem is to connect the external voltage $EV_{CL}$ to the SLP line for a portion of the time during which the sense amps are being activated. Thus, FIG. 1A shows a prior art circuit for supplying the voltage SLP to the sense amp high voltage rail. In FIG. 1A, P-channel transistor P1 is turned on by a low voltage sensing control signal applied to the gate of P1. A voltage $IV_{CL}$ is then applied directly to the SLP line. However, as shown in FIG. 1B, the current drawn by the SLP line is so substantial as to cause the voltage $IV_{CL}$ to dip when the signal SLP is applied to the high voltage rails of the sense amplifiers to turn on the sense amplifiers. The signal SLP is applied to the high voltage rails of the sense amplifiers after the RAS (row address strobe) signal goes high as indicated in FIG. 1B by $\overline{RAS}$, the complement of RAS, going low.

One circuit for overcoming this problem is shown in FIG. 1C. This prior art circuit uses an external voltage source $EV_{CL}$ together with the internal voltage source $IV_{CL}$ to supply current to the high voltage line SLP during the turning on of the sense amplifiers. As shown in FIG. 1D, voltage is applied to the sensing control signal associated with P channel transistors P3 and P4 to turn on these two transistors when $\overline{RAS}$ goes from high to low. In addition low voltage DC (not shown in FIG. 1D) is applied to P-type transistor P2 to turn on transistor P2. The current from the external voltage source $EV_{CL}$ is then applied to the SLP line simultaneously with the current from the internal voltage source $IV_{CL}$. Thus, the current supplied by the SLP line during the turning on of the sense amplifiers is sufficient to prevent a dip in $IV_{CL}$. However, the duration of the voltage D.C. applied to the gate of transistor P2 is difficult to control and thus the actual voltage achieved by the SLP lead line is difficult to control. Since the voltage on the SLP lead determines the ultimate voltage on the bit line BL or $\overline{BL}$, over-charging or under-charging of the SLP rail to the sense amplifiers (as shown in FIG. 1D) is important. The difficulty in controlling the duration of the voltage D.C. applied to P channel transistor P2 as a function of the characteristics of the particular memory array and of the particular portions of the memory array being activated results in a certain overcharge or undercharge of the rail SLP as shown in FIG. 1D.

SUMMARY OF THE INVENTION

In accordance with this invention, a structure and method are provided to prevent the bit lines and the SLP rails associated with the sense amps of a DRAM from being charged above or below the internal power supply level $IV_{CL}$. This is done by monitoring the SLP and SLN signals. An output voltage is then produced proportional to the bit line voltage. Comparing this bit line voltage to a reference voltage in a feedback loop produces a feedback signal to control the turning on or turning off of the external voltage supply as a function of the bit line voltage level. This invention substantially eliminates overshoot or undershoot of the internal voltage level associated with a DRAM integrated circuit.

This invention will be more fully understood in connection with the following detailed description taken together with the drawings.

DESCRIPTION OF THE DRAWINGS

FIG. 1A shows a prior art circuit for charging the SLP line from the internal voltage source $IV_{CL}$.

FIG. 1B illustrates waveforms associated with the structure of FIG. 1A.

FIG. 1C shows an alternative prior art circuit for applying an external voltage $EV_{CL}$ from an external voltage source to provide power to the SLP line during the turning on of the sense amplifiers for a selected period of time.

FIG. 1D shows waveforms associated with the circuit of FIG. 1C.

DETAILED DESCRIPTION

While one embodiment of this invention will be described below those skilled in the art will recognize that other circuitry is capable of implementing this invention. Thus the following description is illustrative only and not limiting.

Figure 2A:
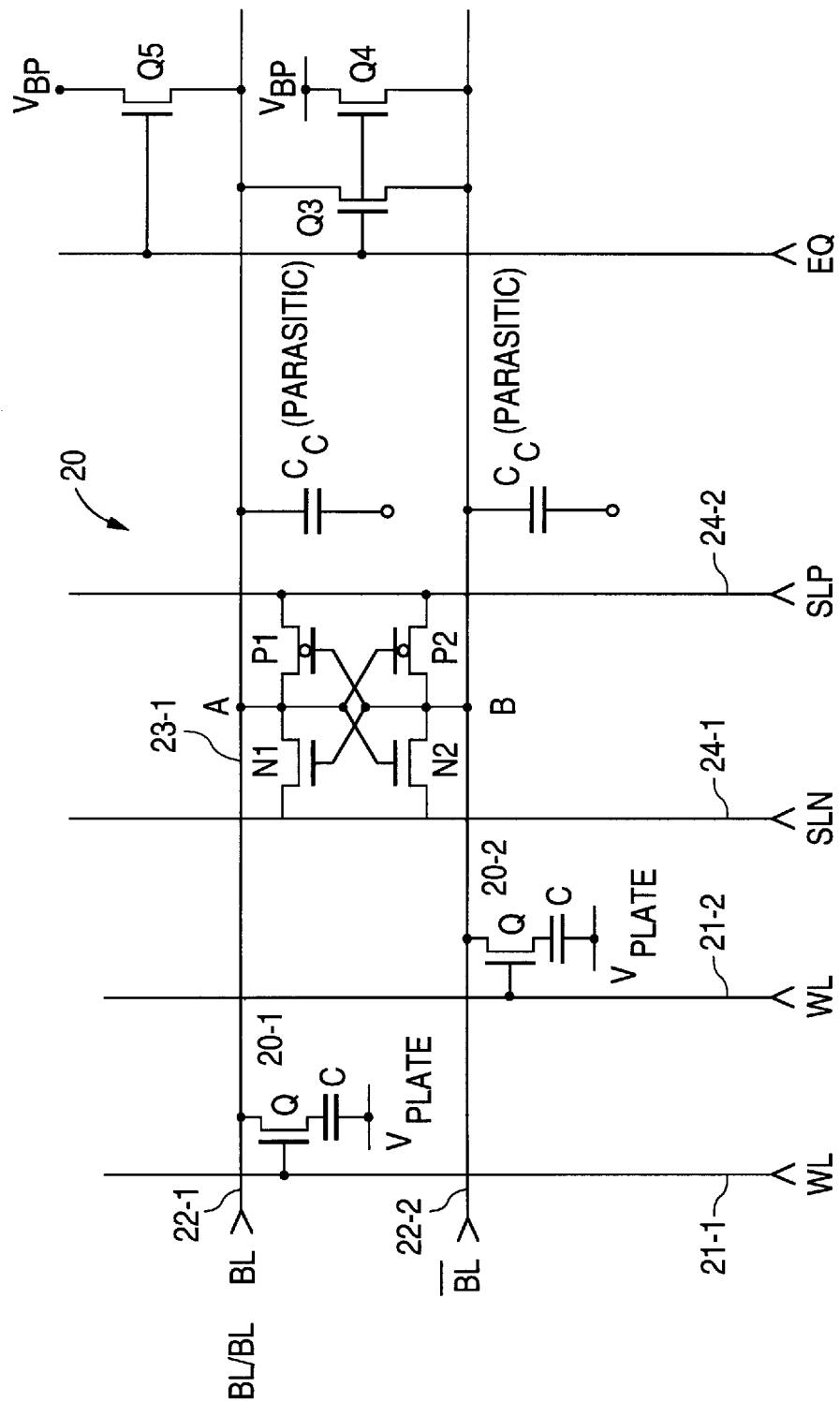
FIG. 2A shows the circuit arrangement of a sense amp and related circuitry associated with a memory array.
Figure 2B:
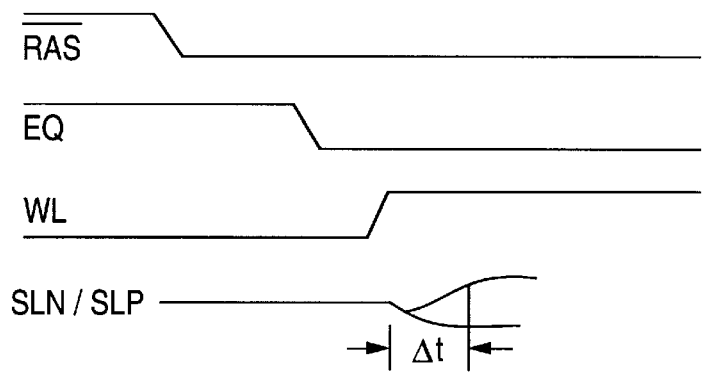
FIG. 2B shows waveforms associated with the circuit arrangement of FIG. 2A.

FIGS. 2A and 2B illustrate the circuitry associated with a single sense amplifier utilized in a dynamic random access memory and the waveforms associated with that circuitry to initiate a read operation. As shown in FIG. 2B, the signal $\overline{RAS}$ (complement of the row address strobe signal RAS) goes low to initiate a read cycle. When EQ is high, transistors Q3, Q4 and Q5 are on thereby equalizing the bitline BL and bitline $\overline{BL}$ voltages at $V_{BP}$, a voltage halfway between VDD, the supply voltage, and VSS, the reference or ground voltage. The capacitance $C_C$ shown in FIG. 2A represents the parasitic capacitance associated with the bitline BL and bitline $\overline{BL}$. The sense amplifier is made up of N type transistors N1 and N2 and P type transistors P1 and P2. When the word line WL 21-1 associated with memory cell 20-1 goes high, N channel pass transistor Q associated with memory cell 20-1 turns on thereby allowing the charge on capacitor C in memory cell 20-1 to affect the voltage on bitline BL 22-1. The $\overline{BL}$ 22-2 is not connected to memory cell 20-1, but rather is connected to memory cell 20-2. Because the word line 21-2 has remained low, N channel pass transistor Q associated with memory cell 20-2 remains off and thus memory cell 20-2 does not affect the state of $\overline{BL}$ 22-2. After word line 21-1 goes high, the signal SLP goes high while the signal SLN goes low thereby activating the sense amp 23-1. Sense amp 23-1 senses the voltage on bitline BL 22-1 on node A and senses the voltage on $\overline{BL}$ 22-2 on node B. If the charge stored on capacitor C in memory cell 20-1 represents a binary 1, then typically charge would be dumped from capacitor C onto bitline 22-1 causing the voltage on bitline BL 22-1 to rise relative to the voltage on bitline $\overline{BL}$ 22-2. On the other hand, if the charge on capacitor C represents a binary 0, the turning on of transistor Q in memory cell 20-1 will cause charge to transfer from bitline 22-1 to capacitor C thereby lowering the voltage on bitline 22-1 relative to the voltage on bitline $\overline{BL}$ 22-2.

Assuming that charge on capacitor C represents a binary 1, then bitline 22-1, using conventional logic, will be at a higher voltage than bitline $\overline{BL}$ 22-2 and thus node A will be at a higher voltage than node B. When the signal SLP goes high, node A will cause N channel transistor N2 to turn on and P channel transistor P2 to turn off relative to N channel transistor N1 and P channel transistor P1. Consequently, the voltage on node B, which is connected to the drain of N type transistor N2 and to the drain of P type transistor P2, will be pulled down towards the voltage SLN on lead 24-1 and the voltage on node A will be pulled up to the voltage on SLP lead 24-2 by P type transistor P1 turning on. N type transistor N1 and P type transistor P2 will both be off. Accordingly sense amplifier will detect and amplify the signal difference between bitline 22-1 and bitline 22-2.

However, as shown above in FIGS. 1B and 1C, the application of a voltage to the SLP line requires a substantial amount of charge to lift the voltage on SLP line 24-2 to the high level corresponding to the internal voltage $IV_{CL}$ on the chip. In accordance with this invention, a circuit is provided to assist the voltage on SLP line 24-2 to reach its desired level without overshoot or undershoot.

Figure 3:
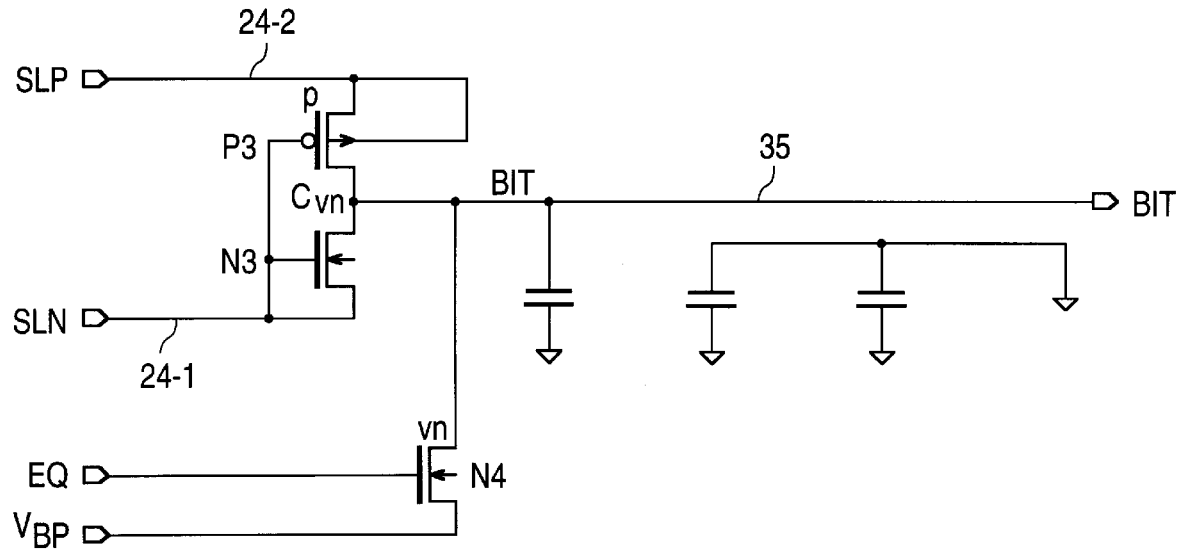
FIG. 3 shows a circuit for measuring the voltage applied to the SLP line in a memory array.

As shown in FIG. 3, the signal SLP is applied to the source of P channel transistor P3 and the signal SLN is applied to the source of N channel transistor N3. The drains of P3 and N3 are connected together. The gates of transistors N3 and P3 are connected together and to the SLN lead 24-1. The potential on lead SLN 24-1 is the circuit reference potential (usually the circuit ground). P type transistor P3 has its substrate connected to its source and N type transistor N3 has its source connected to the gates of both P3 and N3. Thus transistor N3 is essentially off but the voltage at node C corresponding to the drains of transistors P3 and N3 will essentially be the voltage SLP because P3 will be on, pulling the voltage on node C up to the voltage SLP on lead 24-2. This voltage is applied to the line 35 to produce the output signal BIT. The output signal BIT is used in a feedback loop to control the provision of external power from the external voltage source $EV_{CL}$ to the SLP line 24-2. N type transistor N4 has its source connected to $V_{BP}$, a voltage halfway between $V_{DD}$ and $V_{SS}$ and its drain connected to the line 35. The gate of N4 is driven by the signal EQ. When EQ goes low (see FIG. 2B), as it must to allow sense amp 23-1 (FIG. 2A) to be read out, N type transistor N4 is turned off thereby allowing line 35 to track the signal SLP.

Figure 4:
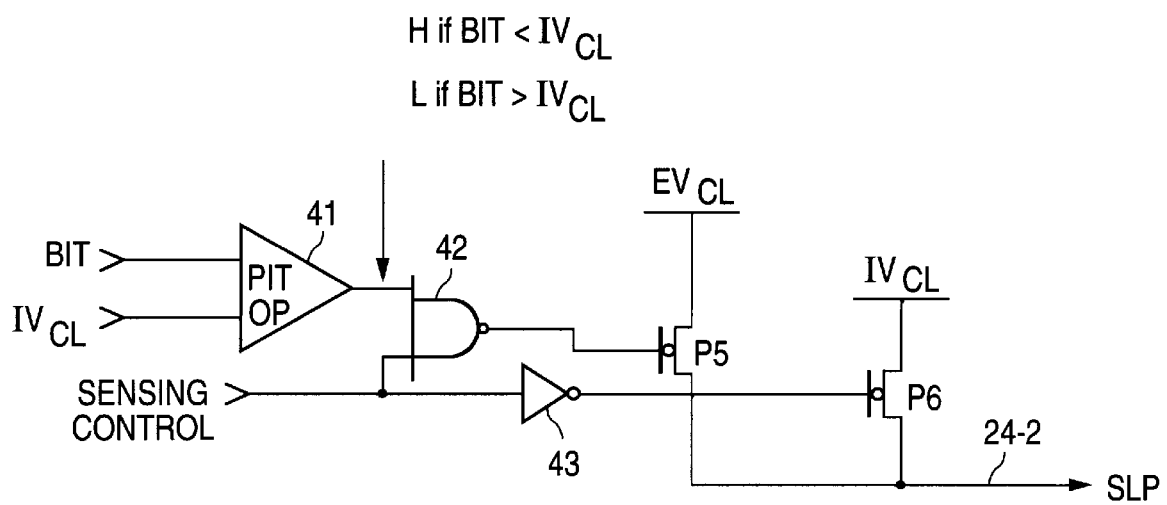
FIG. 4 shows the feedback circuitry using the signal generated by the circuitry of FIG. 3 and the reference voltage to control the voltage applied to the SLP rail.

The signal BIT is provided to the positive input lead of the differential amplifier shown in FIG. 4. The negative input lead of differential amplifier 41 is connected to the source of the reference signal $IV_{CL}$. When the voltage SLP begins to rise, the signal BIT is approximately $V_{BP}$, which is halfway between $V_{DD}$, the external voltage supply to the chip and $V_{SS}$, the reference voltage on chip. $IV_{CL}$, the internal voltage of the chip, is typically at 3.3 volts. When $V_{DD}$ is 5 volts, BIT will be approximately 2.5 volts when voltage SLP begins to rise. Accordingly op amp 41 produces a high level output signal which is applied to one input lead of the two input lead NAND gate 42. The other input lead to NAND gate 42 is driven by a sensing control signal. When the sensing control signal goes high, NAND gate 42 is enabled. Because the output signal of op amp 41 is high level when BIT is beneath $IV_{CL}$, NAND gate 42 produces a low level output signal when the voltage SLP begins to rise. This low level output signal is applied to the gate of P type transistor P5 connected between the external voltage source $EV_{CL}$ and the line SLP. Thus P type transistor P5 turns on and allows the external voltage source $EV_{CL}$ to supply power to the line SLP. So long as the signal on bit line BIT remains beneath the signal $IV_{CL}$, P type transistor P5 remains on.

The sensing control signal (which is high level when NAND gate 42 is enabled) is also inverted by invertor 43 and applied directly to P type transistor P6 connected between the internal, on-chip voltage source $IV_{CL}$ and the SLP lead 24-2. The low level signal applied to the gate of P type transistor P6 turns on P type transistor P6 thereby allowing the internal voltage source $IV_{CL}$ to apply power to the SLP lead 24-2.

So long as the voltage on lead Bit is beneath the voltage $IV_{CL}$, the external voltage source $EV_{CL}$ supplies power to P type transistor P5. When, however, the signal on line 35 (FIG. 3) reaches $IV_{CL}$, the output signal from differential op amp 41 goes low thereby forcing the output signal from NAND gate 42 high. This shuts off P type transistor P5 and thereby disconnects the external voltage source supplying $EV_{CL}$ from SLP line 24-2. The internal voltage supply $IV_{CL}$ continues to supply whatever current is required to bring the charge on the SLP line 24-2 to a level such that the voltage on SLP line 24-2 corresponds to the voltage of the internal voltage supply $IV_{CL}$. Note that the voltage on the SLP line ideally reaches $IV_{CL}$ and will do so when $EV_{CL}$ has been shut off as described above. Even if the sensing control signal remains high for a substantially longer period of time than transistor P5 remains on, the voltage on SLP line 24-2 will not exceed $IV_{CL}$.

Thus this invention has provided a way of avoiding the drop in the voltage $IV_{CL}$ produced by the internal power supply of the memory chip during the charging of the SLP line up to the voltage $IV_{CL}$.

What is claimed is:

1. A structure for charging a high voltage rail associated with a sense amplifier in a dynamic random access memory integrated circuit which comprises:

a first switch connected between an external voltage source and the high voltage rail;

a second switch connected between an internal voltage source and the high voltage rail;

a comparator having two input leads and an output lead, one of the input leads being connected to sense a voltage on said high voltage rail, the other input lead being connected to sense a reference voltage to which the high voltage rail is to be driven and the output lead being connected to control the state of the first switch, the first switch functioning to disconnect the external voltage source from the high voltage rail when the voltage on the high voltage rail equals the voltage on the internal voltage source.

2. Structure as in claim 1 wherein said first switch connecting the external voltage source to the high voltage rail comprises a transistor, the transistor having two terminals and a gate terminal, one of the terminals being connected to the external voltage source, the other terminal being connected to the high voltage rail and the gate terminal being attached to the output lead from said comparator.

3. Structure as in claim 2 wherein the second switch is driven by a signal derived from a sensing control signal.

4. A structure for charging a high voltage rail associated with a sense amplifier in a dynamic random access integrated circuit, comprising:

a first switch connected between an external voltage source and the high voltage rail, wherein the first switch comprises a transistor, the transistor having two terminals and a gate terminal, one of the terminals being connected to the external voltage source, the other terminal being connected to the high voltage rail and the gate terminal being connected to the output lead from said comparator;

a second switch connected between an internal voltage source and the high voltage rail, the second switch being driven by a signal derived from a sensing control signal;

a comparator, comprising a differential operational amplifier having a positive input lead, a negative input lead and an output lead, wherein the positive input lead is connected to a circuit which provides a measure of the voltage on the high voltage rail, the negative input lead is connected to the internal reference voltage $IV_{CL}$ and the output lead is connected to control the state of the first switch, the first switch functioning to disconnect the external voltage source from the high voltage rail when the voltage on the high voltage rail equals the voltage on the internal voltage source.

5. Structure as in claim 4 including a NAND gate having two input leads, one input lead being connected to the output lead of said differential operational amplifier and the other input lead being connected to the sensing control signal.

6. Structure for charging a high voltage rail associated with a sense amplifier in a dynamic random access memory integrated circuit which comprises;

a first switch connected between an external voltage source and the high voltage rail;

a second switch connected between an internal voltage source and the high voltage rail;

a comparator, having two input leads and an output lead, for sensing a voltage on the high voltage rail, for sensing a reference voltage, and for comparing the voltage on the high voltage rail to the reference voltage thereby producing an output signal on the output lead having a first state when the voltage on the high voltage rail is less than the reference voltage and having a second state when the voltage on the high voltage rail is greater than the reference voltage; and circuitry connecting the output lead of said comparator to the first switch so that the first switch connects the external voltage source to the high voltage rail when the output signal from the comparator is in the first state and the first switch disconnects the external voltage source from the high voltage rail when the output signal from the comparator is in the second state.

7. Structure as in claim 6 wherein the first switch comprises a first MOS transistor having a gate terminal, a source terminal and a drain terminal, the gate terminal being connected so as to be controlled by the output signal from said comparator, one of the drain or source terminals being connected to the external voltage source and the other of said drain or source terminals being connected to the high voltage rail.

8. Structure as in claim 7 wherein the second switch comprises a second MOS transistor having a gate terminal, a source terminal and a drain terminal, the gate terminal being controlled by a sensing control signal from a source, one of the source and drain terminals of the second MOS transistor being connected to the internal voltage source and the other of the source and drain terminals of the second MOS transistor being connected to the high voltage rail.

9. Structure for charging a high voltage rail associated with a sense amplifier in a dynamic random access memory integrated circuit, comprising;

a first switch which comprises a first MOS transistor having a gate terminal, a source terminal and a drain terminal, the gate terminal being connected so as to be controlled by the output signal from said comparator, one of the drain or source terminals being connected to the external voltage source and the other of said drain or source terminals being connected to the high voltage rail;

a second switch connected between an internal voltage source and the high voltage rail, the second switch comprising a second MOS transistor having a gate terminal, a source terminal and a drain terminal, the gate terminal being controlled by a sensing control signal from a source, one of the source and drain terminals of the second MOS transistor being connected to the internal voltage source and the other of the source and drain terminals of the second MOS transistor being connected to the high voltage rail;

a comparator having two input leads and an output lead for sensing the voltage on the high voltage rail, for sensing a reference voltage, and for comparing the voltage on the high voltage rail to the reference voltage thereby producing an output signal on the output lead having a first state when the voltage on the high voltage rail is less than the reference voltage and having a second state when the voltage on the high voltage rail is greater than the reference voltage, wherein the output lead of the comparator is connected to one input lead of a NAND gate and the source of said sensing control signal is connected to another input lead of the NAND gate; and circuitry connecting the output lead of said comparator to the first switch so that the first switch connects the external voltage source to the high voltage rail when the output signal from the comparator is in the first state and the first switch disconnects the external voltage source from the high voltage rail when the output signal from the comparator is in the second state.

10. Structure as in claim 9 wherein an output lead of the NAND gate is connected to the gate terminal of the first MOS transistor.

11. A method for controlling a voltage on a high voltage rail associated with a set of sense amplifiers in a dynamic random access memory integrated circuit during charging of the high voltage rail, which comprises:

connecting an external voltage source to the high voltage rail;

connecting an internal voltage source, the internal voltage source being internal to the integrated circuit chip, to the high voltage rail;

comparing the voltage on the high voltage rail to a reference voltage; and disconnecting the external voltage source from the high voltage rail when the voltage on the high voltage rail equals the reference voltage.

* * * * *